United States Patent
Churchward

(10) Patent No.: US 7,567,415 B2
(45) Date of Patent: Jul. 28, 2009

(54) SEPARABLE TRANSIENT VOLTAGE SUPPRESSION DEVICE

(75) Inventor: Jack E. Churchward, Clearwater, FL (US)

(73) Assignee: Honeywell International Inc., Morristown, NJ (US)

( * ) Notice: Subject to any disclaimer, the term of this patent is extended or adjusted under 35 U.S.C. 154(b) by 372 days.

(21) Appl. No.: 11/456,640

(22) Filed: Jul. 11, 2006

(65) Prior Publication Data

US 2008/0013242 A1   Jan. 17, 2008

(51) Int. Cl.
    *H02H 9/00* (2006.01)
(52) U.S. Cl. ..................................... 361/118
(58) Field of Classification Search .............. 361/118, 361/220
    See application file for complete search history.

(56) References Cited

U.S. PATENT DOCUMENTS

| | | |
|---|---|---|
| 4,635,158 A | 1/1987 | Rile |
| 5,195,014 A | 3/1993 | Krantz, Jr. et al. |
| 5,198,958 A | 3/1993 | Krantz, Jr. |
| 5,211,582 A | 5/1993 | Morse et al. |
| 5,306,949 A | 4/1994 | Yamada et al. |
| 5,333,094 A | 7/1994 | Fucito |
| 5,353,189 A | 10/1994 | Tomlinson |
| 5,488,534 A | 1/1996 | Rau et al. |
| 5,539,604 A | 7/1996 | Clark et al. |
| 5,581,434 A | 12/1996 | Landler |
| 5,729,062 A | 3/1998 | Satoh |
| 5,905,622 A | 5/1999 | Finlay, Sr. et al. |
| 6,058,019 A | 5/2000 | Graves et al. |
| 6,678,140 B2 | 1/2004 | Jakwani et al. |
| 6,897,666 B2 | 5/2005 | Swettlen et al. |
| 6,937,480 B2 | 8/2005 | Iguchi et al. |
| 6,965,502 B2 | 11/2005 | Duffy et al. |
| 6,975,494 B2 | 12/2005 | Tang et al. |
| 6,982,859 B1 | 1/2006 | Whitney |
| 7,064,949 B2 * | 6/2006 | Chagny et al. ............... 361/220 |

FOREIGN PATENT DOCUMENTS

| | | |
|---|---|---|
| WO | 96/41356 | 12/1996 |
| WO | 2006110138 A1 | 10/2006 |

* cited by examiner

*Primary Examiner*—Stephen W Jackson

(57) ABSTRACT

An electronic system comprises a system board and a transient voltage suppression (TVS) device coupled to the system board. The TVS device comprises an intermediate coupler coupled to the system board, and a TVS board coupled to the intermediate coupler and having components adapted to suppress transient voltages. The intermediate coupler provides a path between the system board and the TVS board to conduct transient voltage current to the TVS board.

16 Claims, 3 Drawing Sheets

SEPARABLE TRANSIENT VOLTAGE SUPPRESSION DEVICE

BACKGROUND

Transient voltages (e.g. voltage spikes due to lightning, Electrostatic Discharge (ESD), tripped circuit breakers, short circuits, etc.) can disrupt and/or damage components in an electronic system. To protect components from the harmful effects of transient voltages, transient voltage suppression (TVS) components are commonly placed on system boards and printed wiring boards (PWB). Some examples of TVS components include varistors, transient voltage suppression diodes, and gas discharge tubes.

Unfortunately, hazardous conditions still exist on boards even when TVS components are present. The transient voltage current must pass back through the boards to ground. Therefore, even though the TVS components are designed to protect other electronic components on a board, the transient voltage current is still on the board. In the event of failed or defective TVS components, the transient voltage is on the board with the potential to disrupt or damage the other electronic components. It can be costly to replace the components damaged by transient voltages and to repair or replace defective TVS components.

DRAWINGS

The present invention can be more easily understood and further advantages and uses thereof more readily apparent, when considered in view of the description of the embodiments and the following figures in which.

Like reference numbers and designations in the various drawings indicate like elements.

DETAILED DESCRIPTION

Figure 1:
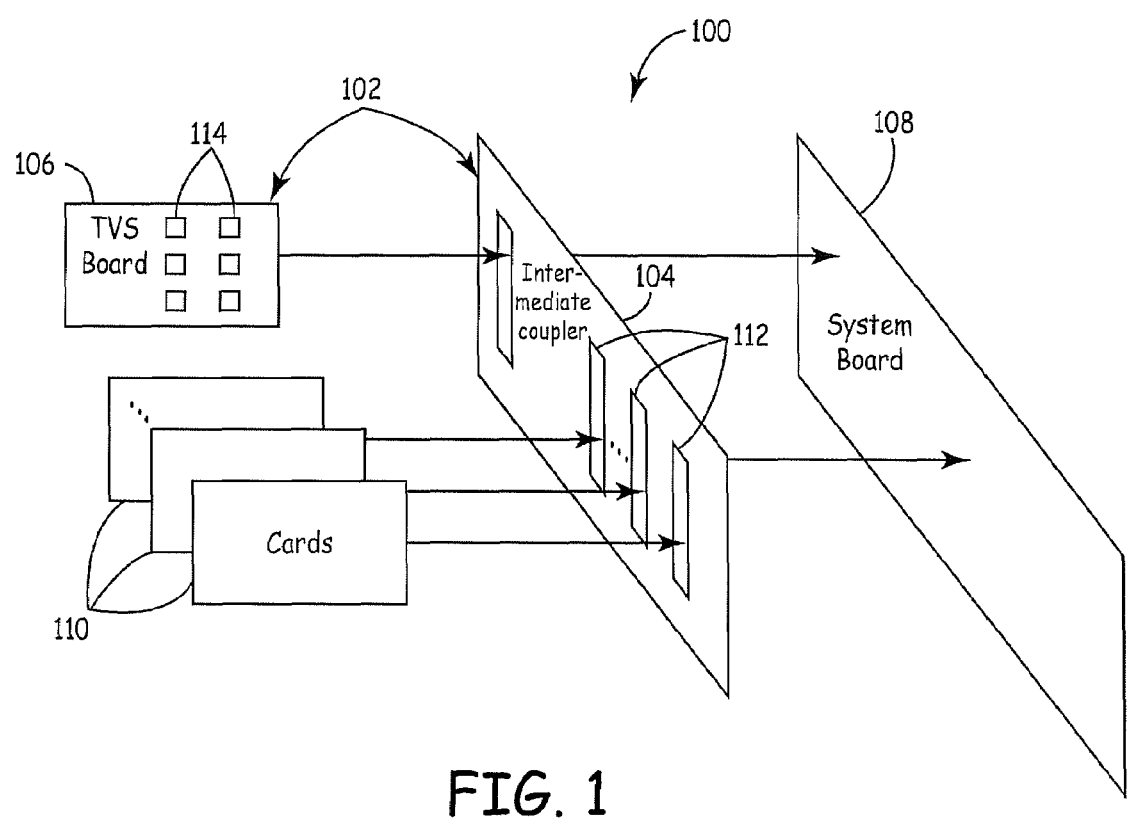
FIG. 1 is a high level block diagram of an electronic system implementing a transient voltage suppression device according to one embodiment of the present invention.

In the following detailed description, reference is made to the accompanying drawings that form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the scope of the present invention. It should be understood that the exemplary method illustrated may include additional or fewer steps. Furthermore, the method presented in the drawing figures or the specification is not to be construed as limiting the order in which the individual steps may be performed. The following detailed description is, therefore, not to be taken in a limiting sense.

Embodiments of the present invention suppress transient voltages without allowing the transient voltages to get onto the boards being protected. Embodiments of the present invention enable this advantage by placing TVS components on a separate board which can be removed and inserted separately. The separate TVS board is connected to a system board and/or additional cards via an intermediate coupler, which provides an electrical path between the TVS board components and the system board and additional cards. Hence, the transient voltages & currents do not get onto the system board and cards. In addition, the cost of replacing or repairing damaged TVS components is significantly reduced because only the TVS board needs to be replaced in the event of failure.

FIG. 1 is an exploded view of a high level block diagram of an electronic system 100 implementing a transient voltage suppression (TVS) device 102 according to one embodiment of the present invention. TVS device 102 comprises an intermediate coupler 104 and a TVS board 106 (also referred to herein as TVS card 106). System 100 also includes a system board 108 and one or more cards 110.

In this embodiment, system board 108 is a backplane without a central processing unit. System board 108 is adapted to connect the one or more cards 110 to each other. Similarly, in this exemplary embodiment, cards 110 are plug-in cards having circuitry for providing different functions to system 100. For example, at least one of cards 110 has a central processing unit. However, it is to be understood that system board 108 can be implemented as other types of system boards in other embodiments. For example, in an alternative embodiment, system board 108 is a motherboard having a central processing unit for on-board processing. In such an embodiment, cards 110 are expansion cards which expand functionality of system 100 but use the central processing unit on-board the motherboard.

As shown, intermediate coupler 104 is adapted to connect between cards 110 and system board 108. In this example embodiment, intermediate coupler 104 has connectors 112 which connect to connectors (not shown) of system board 108. The one or more cards 110 then connect to connectors 112 of intermediate coupler 104. For example, intermediate coupler 104, in one embodiment, has edge connector slots on one side to which are connected the one or more cards 110. In such embodiments, intermediate coupler 104 maps the connectors of cards 110 to connectors of system board 108. Alternatively, intermediate coupler 104 is adapted to allow connectors of the one or more cards 110 to pass through pin holes in intermediate coupler 104, making electrical contact with the pin holes, and connect to system board 108.

Also connected to intermediate coupler 104 is TVS board 106. Intermediate coupler 104 provides a connection from system board 108 and cards 110 to TVS board 106. In this way, intermediate coupler 104 provides a path for conducting transient voltage current (i.e. the current associated with transient voltages) to TVS board 106. TVS board 106 is comprised of components 114 which are adapted to suppress the transient voltages and shunt the current to Ground. TVS board, thus, provides a path to ground without allowing the transient voltage current to pass through system board 108 and cards 110. In this example, TVS board 106 is a printed circuit board and components 114 are TVS diodes. The TVS diodes are avalanche (or alternatively, zener) diodes specially adapted to conduct large currents to ground without being damaged. However, it is to be understood that in other embodiments, other TVS components can be used, such as varistors or gas discharge tubes.

By routing transient voltages to TVS board 106 and away from system board 108 and cards 110, embodiments of the present invention provide improved protection of the electrical components in system 100. Repair costs are also decreased in the event of failed or damaged TVS components because TVS board 106 can be easily replaced without affecting system board 108 or cards 110.

In addition, the protection provided by TVS device 102 is configurable. For example, if protection is not desired for one or more of cards 110, one or more components 114 are not placed on TVS board 106 for those cards 110. In other words, components 114 are only included on TVS board for cards 110 that need protection even if other cards are also connected to intermediate coupler 104. This provides more control over which type of components are used and the cost of including the components. It also allows for easy adjustments. For example, if protection is not initially desired for a given card, protection can be added easily without having to remove or rework the card.

Figure 2:
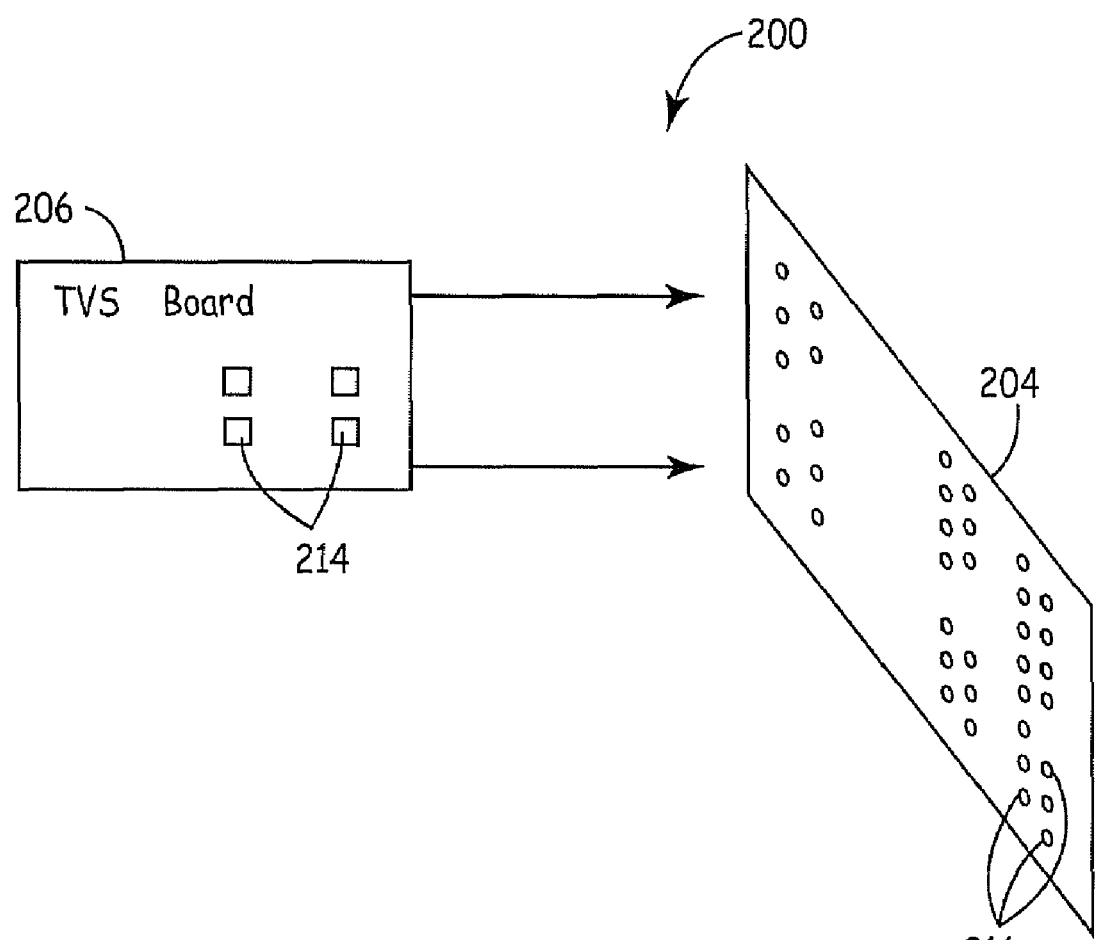
FIG. 2 is a high level block diagram of a transient voltage suppression device according to one embodiment of the present invention.

FIG. 2 is an exploded view of a high level block diagram of a transient voltage suppression (TVS) device 200 according to one embodiment of the present invention. TVS device 200 can be used to implement TVS device 102 shown in FIG. 1. TVS device 200 includes intermediate coupler 204 and TVS board 206. Intermediate coupler 204 is configurable to connect with various different cards. For example, intermediate coupler 204 in FIG. 2 has pin holes 216. The pin hole layout of holes 216 is configurable. That is, the pin hole layout is designed to match a configuration needed for particular cards. Hence, for different pin layout requirements, different intermediate couplers 204 are used.

Pin holes 216 allow pins of cards, such as cards 110 in FIG. 1, to pass through and make electrical contact with intermediate coupler 204. The pins on the cards are then directly connected to a system board. Alternatively, intermediate coupler 204 is adapted with connectors, such as connectors 112 in FIG. 1. In such embodiments, the connectors are chosen to match the requirements of specific cards. Furthermore, any appropriate connection scheme can be used in other embodiments.

Intermediate coupler 204, in this example, is made of a flexible structure. One such flexible structure is a conductive material surrounded by layers of polyester film (e.g. Mylar™ by DuPont). In other embodiments, other flexible structures are used, such as those using a polyimide film (e.g. Kapton™ by DuPont). Furthermore, in other embodiments, intermediate coupler 204 is made of a rigid material.

Intermediate coupler 204 is adapted, in this embodiment, to solder in under the external pin field header of a system board, such as system board 108 in FIG. 1. Alternatively, other means of connecting intermediate coupler 204 to a system board are used in other embodiments. For example, intermediate coupler 204 can be adapted with electrical connectors on both sides. The electrical connectors on one side of intermediate coupler 204 are directly coupled with the system board connectors. The electrical connectors of one or more cards, such as cards 110, are then coupled to the electrical connectors on a second opposite side of intermediate coupler 204.

TVS card 206, in this example, is a printed circuit board containing TVS components 214, such as TVS diodes or varistors. TVS card 206 is adapted to couple to cards and a system board (e.g. cards 110 and system board 108 in FIG. 1) via intermediate coupler 204. In particular, intermediate coupler 204 provides a path for the current of transient voltages to be directed to TVS card 206 and away from the system board and cards, as described above.

Figure 3:
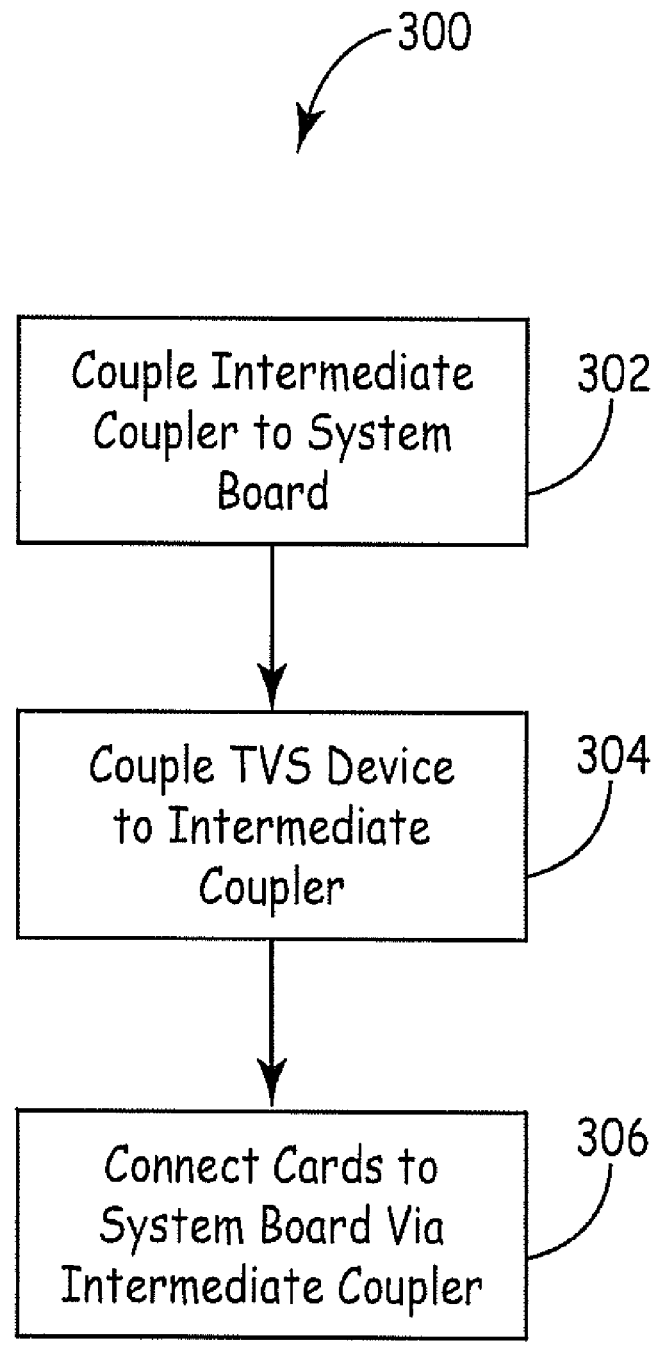
FIG. 3 is a flow chart showing a method of protecting an electronic system from transient voltages according to one embodiment of the present invention.

FIG. 3 is a flow chart showing a method 300 of protecting an electronic system from transient voltages according to one embodiment of the present invention. Notably, although a particular order of performing the method is described and shown in FIG. 3, it is to be understood that the functional blocks of method 300 can be implemented in any appropriate order.

At 302, an intermediate coupler, such as intermediate coupler 104 in FIG. 1, is coupled to a system board, such as system board 108 in FIG. 1. For example, the intermediate coupler can be physically coupled to the system board by soldering it in under the external pin field header of the system board.

At 304, a transient voltage suppression (TVS) device, such as TVS device 106 in FIG. 1, is coupled to the intermediate coupler. The TVS device is comprised of one or more TVS components that are adapted to protect electrical components from excess voltage, such as current due to transient voltages. In addition, by placing the TVS components on a separate TVS board, embodiments of the present invention are able to provide a path to ground without allowing the transient voltage current to reach the system board and cards.

At 306, one or more cards, such as cards 110 in FIG. 1, are connected to the system board via the intermediate coupler. For example, in this embodiment, the card pins pass through pin holes in the intermediate coupler, making electrical contact with the intermediate coupler, and are directly coupled to the system board on the other side of the intermediate coupler. Hence, an electrical path is also formed which conducts transient voltage current to the TVS board and away from the one or more cards.

Alternatively, the intermediate coupler can be adapted with electrical connectors on both sides. The electrical connectors on one side of the intermediate coupler are directly coupled with the system board connectors. The electrical connectors of the one or more cards are then coupled to the electrical connectors on a second opposite side of the intermediate coupler. The electrical connection between the one or more cards and the system board is made via the connectors of the intermediate coupler. In addition, an electrical path is formed which conducts transient voltage current to the TVS board. Therefore, the transient voltage current follows a path to Ground that is NOT through the boards.

Embodiments of the present invention place TVS components on the TVS board for protection of the system board and one or more cards against transient voltages that are in excess of the maximum rated voltage of the part(s) to be protected. In addition to protecting against excessive voltage, embodiments of the present invention also protect against the potential high currents that the TVS components carry to shunt the high currents away from the protected pins of the system board and one or more cards.

Although specific embodiments have been illustrated and described herein, it will be appreciated by those of ordinary skill in the art that any arrangement, which is calculated to achieve the same purpose, may be substituted for the specific embodiments shown without departing from the spirit and scope of the claimed invention. This application is intended to cover any adaptations or variations of the present invention. Therefore, it is manifestly intended that this invention be limited only by the claims and the equivalents thereof.

What is claimed is:

1. An electronic system comprising:
a system board;
a transient voltage suppression (TVS) device coupled to the system board, the TVS device comprising:
an intermediate coupler coupled to the system board; and
a TVS board coupled to the intermediate coupler and having components adapted to suppress transient voltages, wherein the intermediate coupler provides a path between the system board and the TVS board to conduct transient voltage current to the TVS board; and one or more cards having electronic circuitry thereon, the one or more cards being coupled to the system board via the intermediate coupler such that transient voltage currents are substantially conducted away from at least one of the one or more cards to the TVS board.

2. The electronic system of claim 1, wherein the components of the TVS board comprise at least one of varistors, TVS diodes and gas discharge tubes.

3. The electronic system of claim 1, wherein the system board comprises a backplane which does not have an on-board processing circuit.

4. The electronic system of claim 1, wherein the intermediate coupler comprises a flexible structure.

5. The electronic system of claim 4, wherein the flexible structure comprises a conductive material surrounded by one or more layers of a polyester film.

6. The electronic system of claim 1, wherein each of the one or more cards is coupled to components on the TVS board via the intermediate coupler such that transient voltage currents are substantially conducted away from each of the one or more cards to the TVS board.

7. The electronic system of claim 1, wherein the intermediate coupler comprises pin holes through which connectors of the one or more cards couple with connectors of the system board, wherein electrical contact is made between the pin holes and the connectors of the one or more cards.

8. The electronic system of claim 1, wherein the intermediate coupler comprises connectors adapted to couple connectors of the one or more cards to the intermediate coupler, and connectors adapted to couple the intermediate coupler to the system board, wherein the intermediate coupler maps the connectors of the one or more cards to connectors of the system board.

9. The electronic system of claim 1, wherein at least one of the one or more cards further comprises a plug-in card having a central processing unit thereon.

10. A transient voltage suppression (TVS) device comprising:
   a TVS board having components adapted to suppress transient voltages; and
   an intermediate coupler operatively connected to the TVS board, wherein the intermediate coupler is adapted to connect to a system board and at least one card to provide a path conducting transient voltage current to the TVS board away from the system board and the at least one card,
   wherein the intermediate coupler comprises pin holes through which connectors of the at least one card operatively couple with connectors of the system board, wherein electrical contact is made between the pin holes and the connectors of the at least one card.

11. The device of claim 10, wherein the components of the TVS board comprise at least one of varistors, TVS diodes and gas discharge tubes.

12. The device of claim 10, wherein the intermediate coupler comprises connectors adapted to couple connectors of the at least one card to the intermediate coupler and connectors adapted to couple the intermediate coupler to connectors of the system board, wherein the intermediate coupler is adapted to map the connectors of the at least one card to the connectors of the system board.

13. The device of claim 10, wherein the intermediate coupler is comprised of a flexible material.

14. The device of claim 13, wherein the flexible material comprises a conductive material surrounded by one or more layers of a polyester film.

15. A method of protecting an electronic system from transient voltages, the method comprising:
   operatively connecting an intermediate coupler to a system board;
   operatively connecting a transient voltage suppression (TVS) board to the intermediate coupler, wherein the intermediate coupler provides a path conducting transient voltages and current away from a system board to the TVS board; and
   operatively connecting one or more cards to the system board and the TVS board via the intermediate coupler, wherein the intermediate coupler provides a path conducting transient voltages and current away from the one or more cards to the TVS board, wherein operatively connecting the one or more cards to the system board via the intermediate coupler further comprises:
      operatively connecting the one or more cards to connectors on the intermediate coupler.

16. The method of claim 15, wherein operatively connecting the one or more cards to the system board via the intermediate coupler further comprises:
   inserting connectors of the one or more cards through pin holes in the intermediate coupler such that the connectors of the one or more cards make electrical contact with the pin holes and are directly coupled to connectors of the system board.

* * * * *